United States Patent [19]
Walker

[11] Patent Number: 5,521,104
[45] Date of Patent: May 28, 1996

[54] METHOD FOR DRY ETCHING OF POST-PROCESSING INTERCONNECTION METAL ON HYBRID INTEGRATED CIRCUITS

[75] Inventor: William K. Walker, Plano, Tex.

[73] Assignee: Texas Instruments Incorporated, Dallas, Tex.

[21] Appl. No.: 381,693

[22] Filed: Jan. 31, 1995

[51] Int. Cl.$^6$ .............................. C03C 15/00; G01J 1/00; C23F 1/00; B44C 1/22
[52] U.S. Cl. ......................... 437/3; 156/634.1; 156/643.1; 216/13; 216/14; 216/20; 437/228; 437/238; 437/241; 250/338.1
[58] Field of Search .................... 437/3, 228 M, 437/228 PE; 156/643.1, 634.1; 216/13, 14, 20

[56] References Cited

U.S. PATENT DOCUMENTS 5,466,332  11/1995  Owen ........................ 216/20

*Primary Examiner*—Richard L. Schilling
*Attorney, Agent, or Firm*—Ruben C. DeLeon; James C. Kesterson; Richard L. Donaldson

[57] ABSTRACT

This is a system and method of fabricating hybrid integrated circuits (IC). The method may comprise: forming internal IC structures on a substrate; forming IC interlevel insulation on top of the internal IC structures; forming IC top level metal connections on top of the IC interlevel insulation; depositing a protective overcoat over the IC top level metal and the IC interlevel insulation; depositing a dry etch protective layer over the protective overcoat; and dry etching the etch protective layer and the protective overcoat to expose portions of the IC top level metal. The deposition of the protective overcoat may include depositing silicon dioxide or silicon nitride. In addition, the deposition of the dry etch protective layer may include depositing a photosensitive polymide layer. Furthermore, the dry etching may include photolithography. After the etching of the vias, the method may include: forming thermal isolation mesas on the substrate; forming local interconnects over the thermal isolation mesas and the substrate; and connecting uncooled infrared detectors to the internal IC structures through the local interconnects.

13 Claims, 2 Drawing Sheets

METHOD FOR DRY ETCHING OF POST-PROCESSING INTERCONNECTION METAL ON HYBRID INTEGRATED CIRCUITS

CROSS-REFERENCE TO RELATED APPLICATION

The following coassigned patent application is hereby incorporated herein by reference:

| Serial No. | Filing Date | TI Case No. |
| --- | --- | --- |
| 08/223,073 | 04/04/94 | |
| 08/223,087 | 04/04/94 | (Now U.S. Pat. No. 5,466,332). |
| 08/223,088 | 04/04/94 | |

FIELD OF THE INVENTION

This invention generally relates to the manufacture of hybrid integrated circuits and customized ICs.

BACKGROUND OF INVENTION

In the manufacture of hybrid integrated circuits (ICs), unmounted IC chips are electrically connected to each other through the use of a local interconnection metal that is deposited and patterned after the ICs have completed there front-end fabrication and tests. The original IC front-end processing provides chips that have a protective overcoat (PO), typically silicon dioxide ($SiO_2$) or silicon nitride ($Si_3N_4$), in which vias for local interconnection metal have already been provided. Typically this local interconnection metal is an aluminum alloy or titanium tungsten (TiW). These metals must be etched with wet acids because the normal gaseous etchants that are used in dry processing, such as reactive ion etching or plasma etching, attack the PO of the IC even faster than the etch attacks the local interconnection metal. As soon as the PO layer of the IC is penetrated, them is catastrophic, non-repairable damage to the IC.

As a typical example of such hybrid structures, FIG. 1 shows the mounting of an IR sensing array chip 82 to a companion IC signal processing chip 80 such as described in cross-referenced applications Ser. Nos. 08/223,073, 08/223,087 and 08/225,088. FIG. 2 is an enlarged view of the contact via 78 area showing that the PO 84 is placed in jeopardy if etching by dry processing is performed.

For small, controlled conductor line widths, it is very desirable that the local interconnection metal be etched by means of dry processing.

SUMMARY OF THE INVENTION

This invention permits the etching of local interconnection metal, such as used in hybrids and customized ICs by dry processing means. This is accomplished by applying a novel organic coating to the PO side of the IC before any further post-fabrication processing. Contact vias are aligned and patterned with the original vias through the PO. The local interconnection metal is deposited over the protective coating on the wafer and standard photolithography techniques are used to provide the etching mask for the local interconnects. The local interconnection metal may now be etched by dry means without penetration of the additional protective organic coating.

The ability to dry etch the interconnects between ICs of hybrid circuits or the customization interconnects of a single IC allows much more dense electrical connections with quite complex circuits at greater reliability than has heretofore been possible.

This is a system and method of fabricating hybrid integrated circuits (IC). The method may comprise: forming internal IC structures on a substrate; forming IC interlevel insulation on top of the internal IC structures; forming IC top level metal connections on top of the IC interlevel insulation; depositing a protective overcoat over the IC top level metal and the IC interlevel insulation; depositing a dry etch protective layer over the protective overcoat; and dry etching the etch protective layer and the protective overcoat to expose portions of the IC top level metal. The deposition of the protective overcoat may include depositing silicon dioxide or silicon nitride. In addition, the deposition of the dry etch protective layer may include depositing a photosensitive polymide layer. Furthermore, the dry etching may include photolithography. After the etching of the vias, the method may include: forming thermal isolation mesas on the substrate; forming local interconnects over the thermal isolation mesas and the substrate; and connecting uncooled infrared detectors to the internal IC structures through the local interconnects.

BRIEF DESCRIPTION OF THE DRAWINGS

This invention can be best understood by reference to the following drawing(s), in which.

Corresponding numerals and symbols in different figures refer to corresponding parts unless otherwise indicated.

DETAILED DESCRIPTION OF PREFERRED EMBODIMENTS

Figure 1:
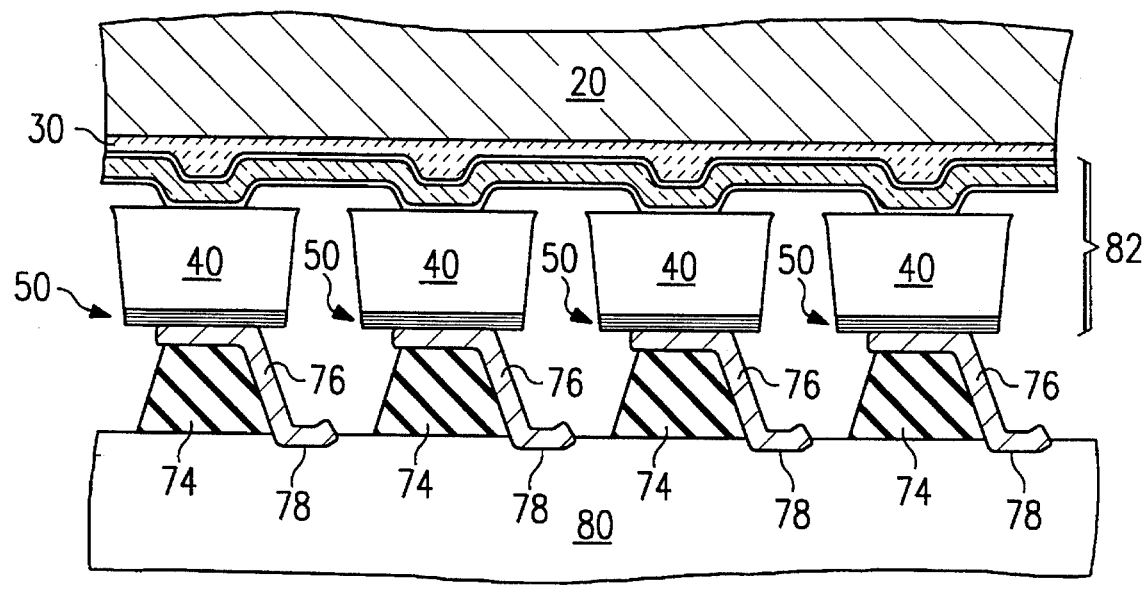
FIG. 1 shows the cross section of an example hybrid structure.

This invention will be described with the aid of FIGS. 1–4 and TABLE 1. The scale of the figures is not intended to be absolute or relative to each other. For clarity of explanation, the material layer thicknesses are exaggerated. The paradigm hybrid chosen for one of the preferred embodiments is the hybrid circuit made of an IR sensing array 82 coupled to a companion signal processing IC 80 as shown in FIG. 1. There can be hundreds of thousands of local interconnections 76 between the two ICs 80 and 82 so it is extremely important to provide a process of high reliability and repeatability. Patterning the local interconnections 76 by plasma etching or reactive ion etching is highly desirable.

Figure 2:
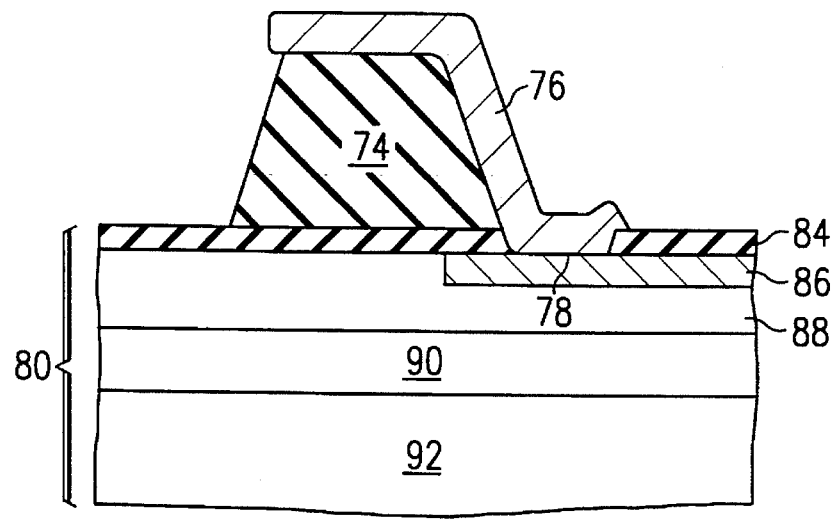
FIG. 2 is an enlargement and shows further detail of the fabrication materials of the ICs shown in FIG. 1.

FIG. 2 shows an enlarged view of the via 78 area with additional material layers added. The protective overcoat (PO) 84 is typically silicon dioxide or silicon nitride. The local interconnection metal 76 is etched by wet means, since the normal gaseous etchant, tetraflourosilane ($SF_6$), as used with dry process etches would destroy the PO 84. If 84 is not in tact, damage can occur to the underlying metal 86, the interlevel insulation 88 or any of the numerous materials that could appear in layer 90 such as polysilicon, nitride, oxide, silicon, aluminum and so on.

TABLE 1

| ID# | Description | Material (dim) | Alternates |
|---|---|---|---|
| 20 | Mechanical carrier | | |
| 30 | Adhesive | Wax | |
| 40 | Temperature sensitive capacitor | Barium strontium titanate | |
| 50 | IC backside electrical contacts | Bonding Alloys such as TiW and Au | 4 layer composite of 15–60 μm In 0.5–1.5 μm Au 0.5–1.5 μm NiCr 0.2–1.0 μm TiW |
| 74 | IC Contact mesa | polyimide | |
| 76 | Ohmic connection | TiW | Aluminum alloy, TiW/Au |
| 78 | IC via | | |
| 80 | IC processor | Si or GaAs | |
| 84 | Protective overcoat | $Si_3N_4$ 1.2 μm | $SiO_2$ |
| 86 | IC top level metal | TiW | TiW/Au, Al alloy, polysilicon |
| 88 | IC interlevel insulation | $SiO_2$ | |
| 90 | Various internal IC structures | Al, Si, $SiO_2$ | |
| 92 | IC substrate | Si | GaAs |
| 94 | Dry etch protective layer | Dupont 2734 photosensitive polyimide 0.25 μm | Thickness from 0.25–5.0 μm. Plasma deposited $SiO_2$, colloidal $SiO_2$, PMMA, PIRL |

Figure 3:
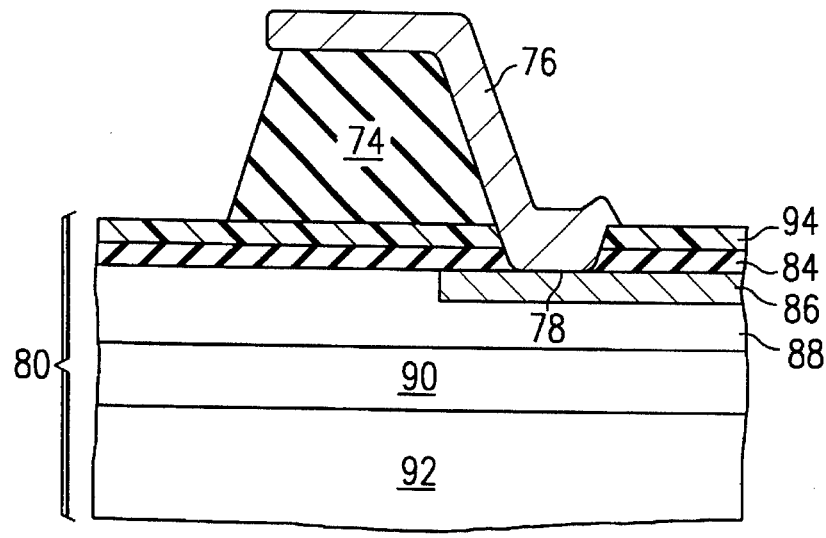
FIG. 3 shows the addition of a protective layer of photosensitive polyimide to the processing IC of FIG. 1.
Figure 4:
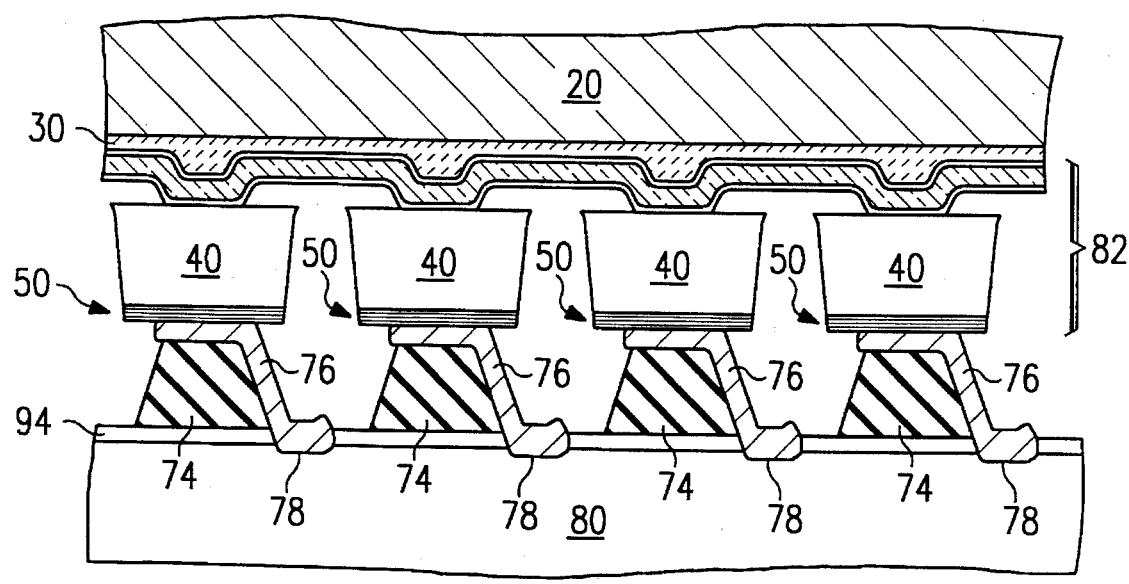
FIG. 4 is analogous to FIG. 2 with the addition of the protective coating.

To permit etching the interconnection metal 76 by dry means, a photosensitive polyimide layer 94 is deposited over the PO 84 as shown in FIG. 3 and FIG. 4. The photosensitive polymide layer 94 covers the vias 78 as well. In addition, the photosensitive polyimide layer 94 can be of the same family of organic polymers as Dupont 2734. Furthermore, polymide layer 94 can be patterned by conventional photolithography using a photomask opaque to ultraviolet (UV) light in the via region 78 and clear where the layer 94 is to remain. Exposing the masked layer 94 to UV polymerices the unmasked material. A suitable solvent developer would then be used to wash away 94 where it was not polymerized, namely vias for connections such as 78.

In the figures shown, polyimide mesas 74 are added over 94 for the purpose of thermal and electrical isolation in this specific example. After mesas 74 are completed and the vias 78 are cleared, the local interconnection metal 76 is deposited over the entire surface of 80. This metal 76 can now be patterned by standard photoresist masking followed by dry means such as plasma etching with $SF_6$ without harm to the PO 84 or any of the underlying layers 86, 88, 90 or 92.

FIG. 4 shows the completed ensemble with the addition of 94 over IC 80. The application of dry etching as an allowable processing step to etch the local interconnection metal adds a degree of control that allows many more interconnections on the same surface area.

While this invention has been described with reference to specific illustrative embodiments, this description is not intended to be construed in a limiting sense. Various modifications and combinations of the illustrative embodiments, as well as other embodiments of the invention, will be apparent to persons skilled in the art upon reference to the description. For example, an organic coating that is not photosensitive may be deposited for layer 94 and then patterned with a coating of standard photoresist.

Other hybrid structures could also benefit from this invention. In the field of very high speed digital signal processing such as required for video, graphics, data compression and expansion, cryptography and similar applications, it would often be beneficial to have high speed memory chips and multiple signal processing chips connected to each other with connections as short as possible. The same constraints against dry etching would apply so that fabrication by the novel methods described herein are equally applicable to these high speed hybrid circuits. Also shown in the example are thermal and electrical isolation mesas which are not necessary for all circuit types.

Another hybrid embodiment might use IC chips made from incompatible manufacturing processes. For example, linear millimeter wavelength microwave circuits of gallium arsenide might be coupled to linear silicon bipolar radio frequency amplifiers coupled to silicon digital bipolar ICs with high capacity memory supplied by metal oxide semiconductor random access memory chips. The small dimensions and density of connections required for this hybrid structure could not be achieved without dry etching. The novel approach described in this invention could be very advantageous for these complex hybrid circuits.

It is not required that a plurality of chips be combined in a hybrid structure to benefit from this invention. There are certain types of digital and analog ICs of a large, complex nature that would benefit from customization by local interconnections applied after the chips have completed their front-end processing, but have not been mounted in packages. It is therefore intended that the appended claims encompass any such modifications or embodiments.

We claim:

1. A method of fabricating hybrid integrated circuits (IC), said method comprising:

a. forming internal IC structures on a substrate;

b. forming IC interlevel insulation on top of said internal IC structures;

c. forming IC top level metal connections on top of said IC interlevel insulation;

d. depositing a protective overcoat over said IC top level metal and said IC interlevel insulation;

e. depositing a dry etch protective layer over said protective overcoat; and f. dry etching said etch protective layer and said protective overcoat to expose portions of said IC top level metal.

2. The method of claim 1, wherein said depositing said protective overcoat includes depositing silicon dioxide.

3. The method of claim 1, wherein said depositing said protective overcoat includes depositing silicon nitride.

4. The method of claim 1, wherein said depositing said dry etch protective layer includes depositing a photosensitive polymide layer.

5. The method of claim 1, wherein said depositing said dry etch protective layer includes depositing photoresist.

6. The method of claim 1, wherein said dry etching includes photolithography.

7. The method of claim 1, wherein said method further includes:

a. forming thermal isolation mesas on said substrate;

b. forming local interconnects over said thermal isolation mesas and said substrate; and c. connecting uncooled infrared detectors to said internal IC structures through said local interconnects.

8. A method of fabricating hybrid integrated circuits (IC) with an uncooled infrared detector, said method comprising:

a. forming uncooled infrared detectors on a first substrate;

b. forming internal IC structures on a second substrate to be connected to said uncooled infrared detectors;

c. forming IC interlevel insulation on top of said internal IC structures;

d. forming IC top level metal connections on top of said IC interlevel insulation;

e. depositing a protective overcoat over said IC top level metal and said IC interlevel insulation;

f. depositing a dry etch protective layer over said protective overcoat;

g. dry etching said etch protective layer and said protective overcoat to expose portions of said IC top level metal;

h. forming thermal isolation mesas on said second substrate;

i. forming local interconnects over said thermal isolation mesas and said substrate; and j. connecting said uncooled infrared detectors to said internal IC structures through said local interconnects.

9. The method of claim 8, wherein said depositing said protective overcoat includes depositing silicon dioxide.

10. The method of claim 8, wherein said depositing said dry etch protective layer includes depositing a photosensitive polymide layer.

11. The method of claim 8, wherein said depositing said dry etch protective layer includes depositing photoresist.

12. The method of claim 8, wherein said dry etching includes photolithography.

13. An uncooled infrared detector, said detector comprising:

a. uncooled infrared detectors on a first substrate;

b. internal IC structures on a second substrate to be connected to said uncooled infrared detectors;

c. IC interlevel insulation on top of said internal IC structures;

d. IC top level metal connections on top of said IC interlevel insulation;

e. a protective overcoat over said IC top level metal and said IC interlevel insulation;

f. vias g. thermal isolation mesas on said protective overcoat; and h. local interconnects over said thermal isolation mesas and said substrate, wherein said uncooled infrared detectors are connected to said internal IC structures through said local interconnects.

* * * * *